(12) United States Patent
Nishihara

(10) Patent No.: US 10,910,326 B2
(45) Date of Patent: Feb. 2, 2021

(54) SEMICONDUCTOR PACKAGE

(71) Applicant: Mitsubishi Electric Corporation, Tokyo (JP)

(72) Inventor: Tatsuto Nishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 91 days.

(21) Appl. No.: 16/303,860

(22) PCT Filed: Nov. 17, 2016

(86) PCT No.: PCT/JP2016/084160
§ 371 (c)(1),
(2) Date: Nov. 21, 2018

(87) PCT Pub. No.: WO2018/092251
PCT Pub. Date: May 24, 2018

(65) Prior Publication Data
US 2020/0273814 A1   Aug. 27, 2020

(51) Int. Cl.
*H01L 23/00* (2006.01)
*H01L 23/047* (2006.01)
(Continued)

(52) U.S. Cl.
CPC ........ *H01L 23/562* (2013.01); *H01L 21/4817* (2013.01); *H01L 21/4882* (2013.01);
(Continued)

(58) Field of Classification Search
None
See application file for complete search history.

(56) References Cited

U.S. PATENT DOCUMENTS 4,172,261 A * 10/1979 Tsuzuki ................. H01L 23/42
252/717
6,921,971 B2 * 7/2005 Basho .................. H01L 23/057
257/675
(Continued)

FOREIGN PATENT DOCUMENTS

JP    3165139 B1    3/2001
JP    4610414 B2   10/2010

OTHER PUBLICATIONS

International Search Report issued in PCT/JP2016/084160; dated Feb. 7, 2017.
(Continued)

*Primary Examiner* — Angel Roman
(74) *Attorney, Agent, or Firm* — Studebaker & Brackett PC

(57) ABSTRACT

A semiconductor package according to the present invention includes a metal plate, a metal base, provided on the metal plate, in which a through hole is formed, a metal block, provided in the through hole, a brazing material covering an upper surface of the metal block, a solder provided on the brazing material, a semiconductor device provided on the solder and a frame provided on the metal base, wherein the frame includes a ceramic part, a difference in thermal expansion coefficient between the metal base and the ceramic part is smaller than a difference in thermal expansion coefficient between the metal block and the ceramic part, the metal block is higher in thermal conductivity than the metal base, and an arithmetic average roughness of an upper surface of the brazing material is not more than a thickness of the solder.

10 Claims, 7 Drawing Sheets

(51) Int. Cl.
*H01L 23/10* (2006.01)
*H01L 23/367* (2006.01)
*H01L 21/48* (2006.01)

(52) U.S. Cl.
CPC ............ *H01L 23/047* (2013.01); *H01L 23/10* (2013.01); *H01L 23/367* (2013.01); *H01L 24/73* (2013.01); *H01L 2224/73265* (2013.01); *H01L 2924/3511* (2013.01)

(56) References Cited

U.S. PATENT DOCUMENTS

| | | | |
|---|---|---|---|
| 9,799,580 B2* | 10/2017 | Li | ............................ H01L 21/52 |
| 2004/0262741 A1* | 12/2004 | Koike | ............... H01L 27/14825 |
| | | | 257/706 |
| 2006/0172465 A1* | 8/2006 | Brennan | ................ H01L 23/36 |
| | | | 438/122 |
| 2006/0249835 A1 | 11/2006 | Miyauchi | |
| 2012/0199955 A1* | 8/2012 | Sun | ................... H01L 23/49827 |
| | | | 257/629 |
| 2013/0299960 A1* | 11/2013 | Chan | ..................... H01L 33/642 |
| | | | 257/706 |

OTHER PUBLICATIONS

Written Opinion issued in PCT/JP2016/084160; dated Feb. 7, 2017.
Notification of Transmittal of the International Search Report and the Written Opinion of the International Searching Authority, or the Declaration issued in PCT/JP2016/084160; dated Feb. 7, 2017.

* cited by examiner

SEMICONDUCTOR PACKAGE

FIELD

The present invention relates to a hermetic sealing semiconductor package.

BACKGROUND

As semiconductor packages which contain a semiconductor device, there are mainly known a resin sealing package and a hermetic sealing package. The former is widely employed because of advantages of being suitable for mass production of memory devices and the like and being inexpensively produced. The latter is one in which a semiconductor device is mounted on a metal base or a ceramic base and is hermetically sealed to be hollow. The hermetic sealing package is more expensive than the resin sealing package. Meanwhile, since the hermetic sealing package has excellent airtightness, it tends to be employed for a product which high reliability is required for.

PTL 1 and PTL 2 disclose hermetic sealing semiconductor packages in which a ceramic terminal is provided on a metal base body. A heat radiator body is embedded in the metal base body, and a semiconductor device is mounted on the heat radiator body. Moreover, the metal base body is formed off material whose coefficient of thermal expansion is close to those of ceramics.

CITATION LIST

Patent Literature

[PTL 1] Japanese Patent No, 3165139
[PTL 2] Japanese Patent No. 4610414

SUMMARY

Technical Problem

With the semiconductor packages in PTL 1 and PTL 2, when the metal base body and the heat radiator body are brazed together, there is a possibility that steps in the vertical direction arise between the metal base body and the heat radiator body. When a step arises such that the rear surface of the heat radiator body is recessed relative to the rear surface of the metal base body, a gap arises between a chassis and the heat radiator body when the semiconductor package is attached to the chassis. Therefore, there can be a case where this causes insufficient heat dissipation. Moreover, when the heat radiator body protrudes from the rear surface of the metal base body, the heat radiator body comes in excellent press contact with the chassis, which leads to efficient heat dissipation. Meanwhile, the resulting step causes the semiconductor package to bend. There is a possibility that breakage arises, due to stress caused by this bend, on the ceramic terminal, and the circuit board and the semiconductor device mounted on the semiconductor package.

The present invention is devised in order to solve the aforementioned problems, and an object thereof is to obtain a semiconductor package capable of suppressing breakage on a ceramic terminal and attaining efficient heat dissipation of heat generated from a semiconductor device.

Solution to Problem

A semiconductor package according to the present invention includes a metal plate, a metal base, provided on the metal plate, in which a through hole penetrating from an upper surface to a rear surface is formed, a metal block, provided in the through hole, an upper surface of which is provided at a lower position than the upper surface of the metal base, a brazing material covering the upper surface of the metal block, a solder provided on the brazing material, a semiconductor device provided on the solder, a frame provided on the metal base and enclosing the semiconductor device, a lid provided on the frame and covering a region enclosed by the frame and a lead electrically connected to the semiconductor device and extending to an opposite side to the semiconductor device relative to the frame, wherein the frame includes a ceramic part to which the lead is attached, a difference in thermal expansion coefficient between the metal base and the ceramic part is smaller than a difference in thermal expansion coefficient between the metal block and the ceramic part, the metal block is higher in thermal conductivity than the metal base, and an arithmetic average roughness of an upper surface of the brazing material is not more than a thickness of the solder.

Advantageous Effects of Invention

In the semiconductor package according to the invention of this application, the metal base and the metal block are provided on the metal plate. Therefore, a step can be prevented from being formed on the rear surface of the semiconductor package. Accordingly, there can be prevented deterioration of heat dissipation due to a step and breakage on the ceramic part. Moreover, the ceramic part is provided on the metal base. The metal base is smaller in difference in thermal expansion coefficient from the ceramic part than the metal block is. Therefore, breakage on the ceramic part can be suppressed. Furthermore, the small arithmetic average roughness of the upper surface of the brazing material can suppress occurrence of voids in the solder. Accordingly, this leads to efficient heat dissipation of the semiconductor device.

DESCRIPTION OF EMBODIMENTS

Figure 1:
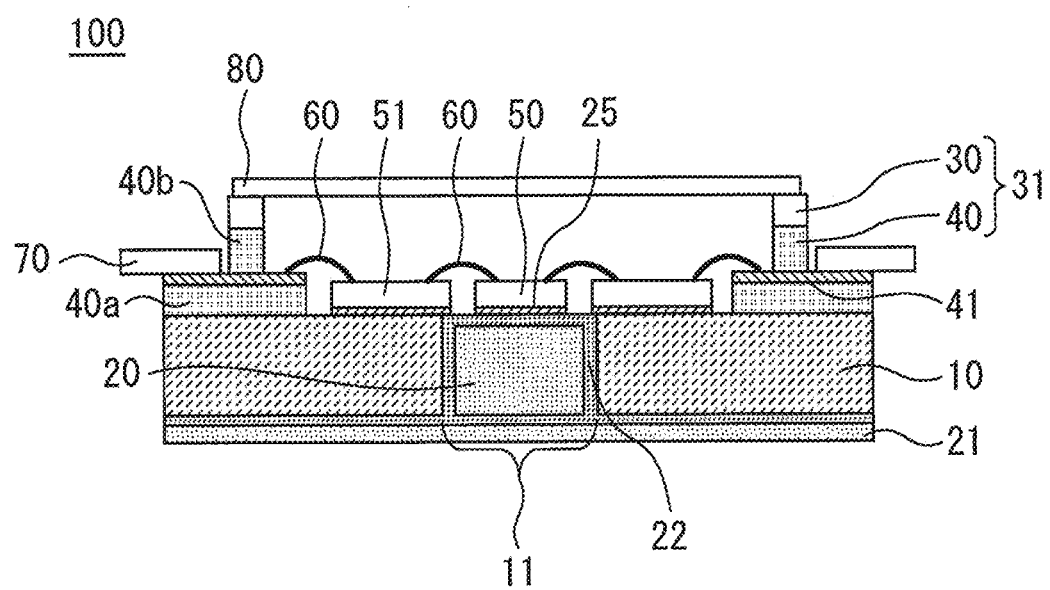
FIG. 1 is a cross-sectional view of a semiconductor package according to Embodiment 1.

Semiconductor packages according to embodiments of the present invention are described with reference to drawings. Identical or corresponding constitutional elements are given the same reference numerals, and the repeated description of such constitutional elements may be omitted.

Embodiment 1

FIG. 1 is a cross-sectional view of a semiconductor package according to Embodiment 1. A semiconductor package 100 according to the present embodiment includes a metal plate 21. The metal plate 21 is formed of copper. Copper has 394 W/m·K of thermal conductivity with a high heat dissipation property. Moreover, copper has $19 \times 10^{-6}$/K of coefficient of thermal expansion. A metal base 10 is provided on the metal plate 21. The metal base 10 is formed of an iron-nickel-cobalt alloy. The iron-nickel-cobalt alloy has 17 W/m·K of thermal conductivity. Moreover, the iron-nickel-cobalt alloy has $4.9 \times 10^{-6}$/K of coefficient of thermal expansion. A through hole 1 penetrating from the upper surface of the metal base 10 to the rear surface thereof is formed therein. The through hole 11 is formed right below a semiconductor device 50.

A metal block 20 is provided in the through hole 11. The thickness of the metal block 20 is smaller than the thickness of the metal base 10. For example, the thickness of the metal base 10 is 1.3 mm, and the thickness of the metal block 20 is 1.2 mm. The upper surface of the metal block 20 is provided at a lower position than the upper surface of the metal base 10. The metal block 20 is formed of copper. The sectional shape of the metal block 20 is quadrangular.

The metal plate 21, the metal base 10 and the metal block 20 are joined to one another with a brazing material 22. The brazing material 22 is provided between the rear surfaces of the metal base 10 and the metal block 20 and the upper surface of the metal plate 21. Moreover, in the through hole 11, the brazing material 22 is provided between the metal base 10 and the metal block 20. Furthermore, the brazing material 22 covers the upper surface of the metal block 20. In the present embodiment, the brazing material 22 is a silver brazing material. The upper surface of the brazing material 22 provided on the upper surface of the metal block 20 has the same height as that of the upper surface of the metal base 10.

A frame 31 is provided on the metal base 10. The frame 31 is provided in a peripheral portion of the metal base 10 and encloses the semiconductor device 50 and a circuit board 51. The frame 31 includes an annular metal frame 30. The metal frame 30 is formed of an iron-nickel-cobalt alloy. A through hole is provided in the metal frame 30. The frame 31 includes a ceramic part 40. The ceramic part 40 is also called a ceramic terminal. The ceramic part 40 is embedded in the through hole provided in the metal frame 30. The ceramic part has $6.7 \times 10^{-4}$/K of coefficient of thermal expansion. The metal frame 30 and the ceramic part 40 are provided on the upper surface of the metal base 10.

The ceramic part 40 does not have electric conductivity. Therefore, the ceramic part 40 is insulated from the metal frame 30. The ceramic part 40 includes a first ceramic part 40a provided on the metal base 10. A metallizing layer 41 is provided on the upper surface of the first ceramic part 40a. A second ceramic part 40b smaller in width than the first ceramic part 40a is provided on the metallizing layer 41. The metallizing layer 41 is formed continuously from the inside of the frame 31 to the outside thereof. Accordingly, the metallizing layer 41 electrically connects the inside and the outside of the frame 31 together.

A lid 80 is provided on the frame 31. The lid 80 is provided on the metal frame 30. The lid 80 covers the region enclosed by the frame 31. The lid 80 is formed of a metal. The metal base 10 and the metal frame 30 are joined to each other with a silver brazing material. The metal base 10 and the ceramic part 40 are joined to each other with a silver brazing material. The metal frame 30 and the ceramic part 40 are joined to each other with a silver brazing material. Moreover, the lid 80 is joined to the metal frame 30 with gold-tin solder or by seam welding. According to the above, the semiconductor package 100 forms a hollow structure. As a result, the semiconductor device 50 and the circuit board 51 enclosed by the frame 31 is hermetically sealed.

The semiconductor package 100 includes the semiconductor device 50. The semiconductor device 50 is provided above the metal block 20. Moreover, the circuit board 51 is mounted on the metal base 10. The circuit board 51 is formed of ceramics. The semiconductor device 50 is connected to the circuit board 51 with wires 60. Moreover, the circuit board 51 is connected to the metallizing layer 41 with wires 60. The wire 60 is joined to a portion, of the metallizing layer 41, that is positioned inside the frame 31.

Outside the frame 31, a lead 70 is attached to the ceramic part 40. The lead 70 is joined to the metallizing layer 41 outside the frame 31. According to the above, the lead 70 is electrically connected to the semiconductor device 50. The lead 70 extends to the opposite side to the semiconductor device 50 relative to the frame 31. The lead 70 is joined to the metallizing layer 41 with a silver brazing material.

Above the upper surface of the metal block 20, a solder 25 is provided on the brazing material 22. The semiconductor device 50 is provided on the solder 25. Above the metal block 20, the semiconductor device 50 is soldered to the brazing material 22. Moreover, the circuit board 51 is soldered to the metal base 10. The solder 25 is, for example, gold-tin solder. The thickness of the solder 25 is 0.02 mm.

Figure 2:
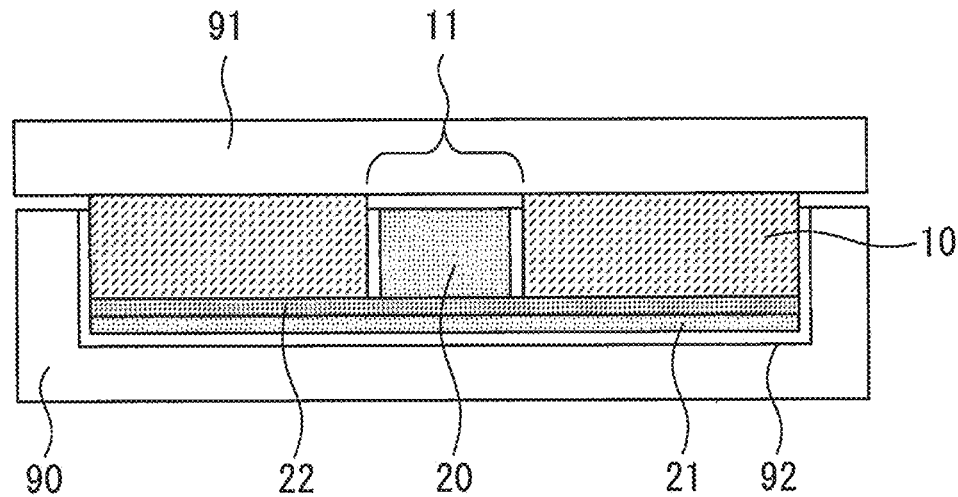
FIG. 2 is a diagram for describing a manufacturing method of the semiconductor package according to Embodiment 1.

FIG. 2 is a diagram for describing a manufacturing method of the semiconductor package according to Embodiment 1. Using FIG. 2, a method of joining the metal block 20 and the metal plate 21 to the metal base 10 is described. First, an assembly jig 90 is prepared. A recess part 92 to contain the metal base 10, the metal block 20 and the metal plate 21 is formed in the assembly jig 90. Next, the metal plate 21 is placed on the bottom surface of the recess part 92. Next, the brazing material 22 is placed on the metal plate 21. In this stage, the brazing material 22 is flat plate-shaped. Moreover, the brazing material 22 covers the metal plate 21.

Next, the metal base 10 is placed on the brazing material 22. In this state, the metal base 10 protrudes from the upper surface of the assembly jig 90. Next, the metal block 20 is inserted into the through hole 11. Next, a stone weight 91 is placed on the metal base 10. Here, the stone weight 91 closes the through hole 11. Moreover, the upper surface of the metal block 20 is provided at a lower position than the upper surface of the metal base 10. Therefore, a gap arises between the stone weight 91 and the metal block 20.

Next, the assembly jig 90 is heated at a temperature not less than 780 degrees, at which silver braze melts. As a result, the molten brazing material 22 spreads between the rear surfaces of the metal base 10 and the metal block 20 and the upper surface of the metal plate 21 to wet these. Furthermore, load of the stone weight 91 is exerted on the molten brazing material 22. Therefore, the brazing material 22 spreads upward through a gap between the metal base 10 and the metal block 20 by capillarity. Furthermore, the brazing material 22 spreads between the rear surface of the stone weight 91 and the upper surface of the metal block 20 to wet these. A gap between the metal block 20 and the stone weight 91 is filled with the brazing material 22.

After that, the assembly jig 90 is gradually cooled to solidify the brazing material 22. As a result, the metal block 20 and the metal plate 21 are joined to the metal base 10. Moreover, the upper surface of the metal block 20 is covered by the brazing material 22. In the present embodiment, an arithmetic average roughness Ra of the rear surface of the stone weight 91 is set to be Ra≤0.02 mm. In this stage, the portion, of the brazing material 22 which wettingly spreads after melting, that is in contact with the rear surface of the stone weight 91 is finished to have a roughness corresponding to the arithmetic average roughness Ra of the rear surface of the stone weight 91 in its solidification. Accordingly, the arithmetic average roughness Ra of the upper surface of the brazing material 22 covering the upper surface of the metal block 20 is not more than 0.02 mm.

As a modification of the above, the upper surface of the metal block 20 may be provided at the same height as that of the upper surface of the metal base 10. In this ease, a gap does not arise between the metal block 20 and the stone weight 91. The brazing material 22 spreads to the rear surface of the stone weight 91 to wet this through the gap between the metal base 10 and the metal block 20. In this case, the upper surface of the metal block 20 is exposed from the brazing material 22.

For an assembly process of the semiconductor package 100, the step of joining the metal base 10, metal block 20 and the metal plate 21 to one another may be beforehand performed. Otherwise, the whole semiconductor package 100 may be assembled at once.

Figure 3:
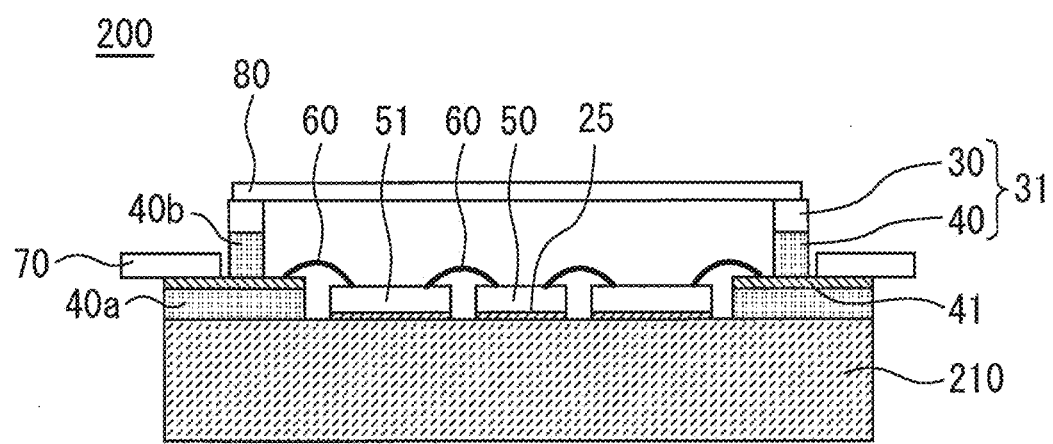
FIG. 3 is a cross-sectional view of a semiconductor package according to a first comparative example of Embodiment 1.

FIG. 3 is a cross-sectional view of a semiconductor package according to a first comparative example of Embodiment 1. A semiconductor package 200 according to the first comparative example includes a metal base 210. A copper alloy material is used for the metal base 210. The copper alloy material is, for example, a copper-molybdenum alloy. The copper alloy material has a high thermal conductivity and is excellent in heat dissipation property. In the semiconductor package 200, heat generated from the semiconductor device 50 is received by the metal base 210, and the heat is transmitted to the rear surface side of the metal base 210.

In the semiconductor package 200, the whole metal base 210 is formed of a copper alloy. Moreover, the circuit board 51 small in heat generation is also mounted on the copper ahoy. Therefore, there can be a case where the metal base 210 is expensive, which causes a high price of the semiconductor package 200.

The copper-molybdenum alloy has $11.3 \times 10^{-6}/K$ of coefficient of thermal expansion. Accordingly, the coefficient of thermal expansion of the metal base 210 is far larger than the coefficients of thermal expansion of the ceramic part 40 and the metal frame 30. Therefore, such difference in coefficient of thermal expansion occasionally causes breakage on the ceramic part 40 in the manufacturing process.

Moreover, in the first comparative example, differences between the coefficient of thermal expansion of the metal base 210 and the coefficients of thermal expansion of the ceramic part 40, the semiconductor device 50 and the circuit board 51 are large. Therefore, there is a possibility that a warp arises on the semiconductor package 200 when the semiconductor device 50 and the circuit board 51 are mounted thereon using gold-tin solder. This warp causes a possibility of breakage arising on the ceramic part 40, the circuit hoard 51 and the semiconductor device 50.

On the contrary, when the metal base 210 is formed of an iron-nickel-cobalt alloy, the difference in coefficient of thermal expansion between the metal base 210 and the ceramic part 40 is small. Accordingly, breakage on the ceramic part can be prevented. Nevertheless, the thermal conductivity of the iron-nickel-cobalt alloy is far lower than that of the copper alloy. Therefore, there can be a case where this results in insufficient heat dissipation of heat generated from the semiconductor device.

Furthermore, higher output of the semiconductor device 50 more increases the amount of heat generated in operation thereof. Therefore, there can be a case of difficulty in sufficient heat dissipation of heat generated from the semiconductor device 50 with a copper alloy. There is a possibility that such insufficient heat dissipation causes failure of the semiconductor device 50 due to the heat generation. It can be considered that, in order to enhance the heat dissipation property, the metal base 210 is formed of copper. Copper has a high heat dissipation property. Nevertheless, the coefficient of thermal expansion of copper is larger than the coefficient of thermal expansion of the copper-molybdenum alloy. Therefore, this causes a larger difference in coefficient of thermal expansion between the metal base 210 and the ceramic part 40. Therefore, the ceramic part 40 tends to break in the manufacturing process.

Figure 4:
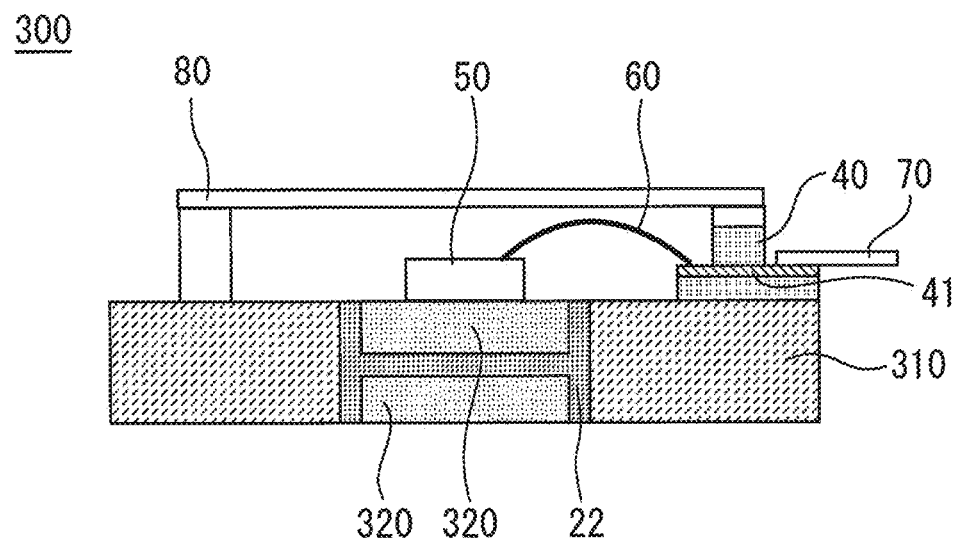
FIG. 4 is a cross-sectional view of a semiconductor package according to a second comparative example of Embodiment 1.

FIG. 4 is a cross-sectional view of a semiconductor package according to a second comparative example of Embodiment 1. A semiconductor package 300 according to the second comparative example includes a metal base 310. The metal base 310 is formed of an iron-based material. A through hole is provided in the metal base 310. Two heat radiator bodies 320 are provided in the through hole. The heat radiator body 320 is formed of a copper-based material. The brazing material 22 are sandwiched between the two heat radiator bodies 320. When the metal base 310 is heated in this state, the metal base 310 and the heat radiator bodies 320 undergo metal joining.

Nevertheless, in the semiconductor package 300, there is a possibility that steps in the vertical direction arise between the metal base 310 and the heat radiator bodies 320 in the state where the metal base 310 and the heat radiator bodies 320 are brazed to one another. If a step arises on the rear surface of the semiconductor package 300, there can be a case where heat dissipation is disturbed. Moreover, there can be a case where such a step causes the semiconductor package 300 to bend. There is a possibility that stress due to the bend causes breakage on the ceramic part 40, the circuit board 51 and the semiconductor device 50.

Moreover, in the semiconductor package 300, in order to make the step on the rear surface thereof small, there is needed a step of polishing the rear surface of the semiconductor package 300 after the assembly of the package. Therefore, there is a possibility that this raises production costs.

Figure 5:
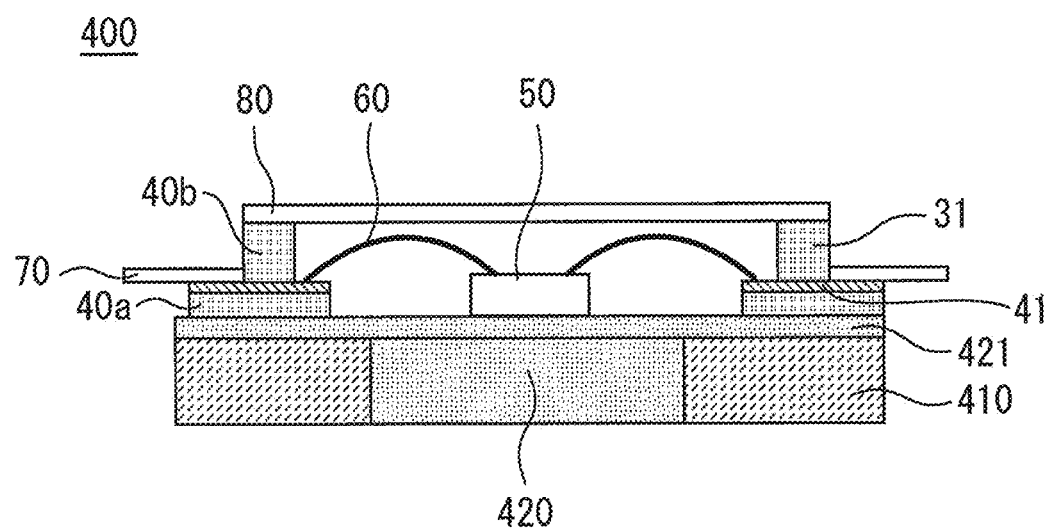
FIG. 5 is a cross-sectional view of a semiconductor package according to a third comparative example of Embodiment 1.

FIG. 5 is a cross-sectional view of a semiconductor package according to a third comparative example of Embodiment 1. A semiconductor package 400 according to the third comparative example includes a metal base body 410. A through hole is formed in the metal base body 410. The through hole is filled with a penetrating metal body 420. The penetrating metal body 420 is higher in thermal conductivity than the metal base body 410. Furthermore, a thermal diffusion metal layer 421 is provided on the metal base body 410 and the penetrating metal body 420. The thermal diffusion metal layer 421 is higher in thermal conductivity than the metal base body 410. The semiconductor device 50 is mounted right above the penetrating metal body 420.

Also in the semiconductor package 400, there is a possibility that a step in the vertical direction arises between the metal base body 410 and the penetrating metal body 420 in the state where the metal base body 410, the penetrating metal body 420 and the thermal diffusion metal layer 421 are brazed to one another. In the third comparative example, there is a possibility that a step arises on the rear surface of the semiconductor package 400. Accordingly, there is a possibility that the same problems as in the semiconductor package 300 arise.

On the contrary, in the semiconductor package 100 according to the present embodiment, the metal plate 21 is provided on the rear surface of the metal base 10 and the rear surface of the metal block 20. Therefore, a step does not arise on the rear surface of the semiconductor package 100. Accordingly, heat dissipation can be prevented from being disturbed due to a step. Moreover, breakage on the ceramic part 40, the circuit board 51 and the semiconductor device 50 arising due to a bend of the package can be prevented. The metal plate 21 has a thickness at which it does not suffer wrinkles when it is heated and silver brazed. The thickness of the metal plate 21 is preferably, for example, 0.05 mm to 0.1 mm.

Moreover, in the present embodiment, there is not needed processing of polishing and flattening the rear surface of the semiconductor package 100. Accordingly, the semiconductor package 100 can be inexpensively manufactured. Moreover, a step does not arise between the brazing material 22 provided on the upper surface of the metal block 20 and the upper surface of the metal base 10. Therefore, an arrangement of the circuit board 51 is not restricted due to such a step.

Moreover, in the present embodiment, the thickness of the metal base 10 is 1.3 mm, and the thickness of the metal plate 21 is 0.05 mm to 0.1 mm. The metal plate 21 is far thinner than the metal base 10. There can be a case where, if the metal plate 21 is thick, the difference in coefficient of thermal expansion between the metal base 10 and the metal plate 21 causes a warp on the metal base 10 in the state where the metal plate 21 and the metal base 10 are joined together. In the present embodiment, the thin metal plate 21 can suppress a warp of the metal base 10.

Moreover, in the present embodiment, the metal block 20 is formed of copper, and the metal base 10 is formed of an iron-nickel-cobalt alloy. The metal block 20 is higher in thermal conductivity than the metal base 10. The semiconductor device 50 is mounted right above the metal block 20, which has a high thermal conductivity. Therefore, heat generated form the semiconductor device 50 can be efficiently transmitted to the rear surface side of the semiconductor package 100. Accordingly, this can lead to efficient heat dissipation. The semiconductor device 50 is preferably mounted on the center line of the metal block 20 in order to enhance the heat dissipation property.

Moreover, the difference in thermal expansion coefficient between the metal base 10 and the ceramic part 40 is smaller than the difference in thermal expansion coefficient between the metal block 20 and the ceramic part 40. The ceramic part 40 and the circuit board 51 are mounted on the metal base 10. The metal base 10 is smaller in coefficient of thermal expansion than the metal block 20, and is close in coefficient of thermal expansion to ceramics. Accordingly, breakage on the ceramic part 40 in the manufacturing process can be prevented. Therefore, the yield of semiconductor packages can be suppressed from deteriorating, which can suppress a high price thereof.

Moreover, the circuit hoard 51 is smaller in amount of heat generation than the semiconductor device 50. In the present embodiment, the semiconductor device 50 larger in amount of heat generation is mounted on the metal block 20 formed of copper. Moreover, the circuit board 51 smaller in amount of heat generation is mounted on the metal base 10 smaller in thermal conductivity than the metal block 20. In general, an iron-nickel-cobalt alloy is less expensive than copper. Accordingly, the cost of the semiconductor package 100 can be held down.

Furthermore, the metal plate 21 is joined to the rear surface of the metal base 10. The metal plate 21 is formed of copper. Therefore, when the semiconductor package 100 is fixed to a chassis with screws, the metal plate 21 is brought into press contact with the chassis with screw fastening force. Hence, the semiconductor package 100 can be implemented without gaps. Accordingly, further efficient heat dissipation of the semiconductor device 50 can be attained.

Moreover, gold-tin solder is lower in thermal conductivity than copper. Therefore, there is a possibility that, when gold-tin solder is provided to be thick, sufficient heat dissipation of the semiconductor device 50 cannot be attained. For sufficient heat dissipation of the semiconductor device 50, the thickness of the solder 25 is set to be 0.02 mm. Here, there are to arise, on the upper surface of the brazing material 22, projections exceeding the thickness of the solder 25 when the arithmetic average roughness Ra of the upper surface of the brazing material 22 on which the solder 25 is provided is larger than the thickness of the solder 25. In this case, there is a possibility that voids arise in the solder 25. There can be a case Where the thermal conduction property decreases when voids arise in the solder 25 for joining the semiconductor device 50.

Moreover, when a semiconductor package is conducted to a temperature cycle test, the solder contracts due to the temperature change. Therefore, in general, there is a possibility that, when a projection the height of which exceeds 0.02 mm exists in gold-tin solder, breakage starting from the projection arises on the semiconductor device. Here, the temperature cycle test is supposed to be performed in an environment with −65° C. to 175° C. of temperature.

On the contrary, in the present embodiment, the arithmetic average roughness of the upper surface of the brazing material 22 covering the upper surface of the metal block 20 is not more than 0.02 mm. The arithmetic average roughness Ra of the upper surface of the brazing material 22 is not more than the thickness of the solder 25. Accordingly, voids can be suppressed from arising in the solder 25. Accordingly, the thermal conduction property can be suppressed from decreasing. Moreover, breakage on the semiconductor device 50 due to a temperature cycle test can be prevented.

In the present embodiment, the upper surface of the brazing material 22 is finished to have a roughness corresponding to the arithmetic average roughness Ra of the rear surface of the stone weight 91. Therefore, the arithmetic average roughness Ra of the upper surface of the brazing material 22 can be easily adjusted depending on the thickness of the solder 25.

Moreover, the metal block 20 may be formed of another material as long as it is higher in thermal conductivity than the metal base 10. Moreover, the metal base 10 may be formed of another material as long as its difference in thermal expansion coefficient from the ceramic part 40 is smaller than the difference in thermal expansion coefficient between the metal block 20 and the ceramic part 40.

Moreover, the semiconductor package 100 according to the present embodiment includes two ceramic parts 40 and two leads 70. The ceramic parts 40 and the leads 70 are respectively provided at both ends of the metal base 10. Meanwhile, the semiconductor package 100 may include one ceramic part 40 and one lead 70. In this case, the ceramic part 40 and the lead 70 are provided only at one of both ends of the metal base 10.

Moreover, the circuit board 51 is configured to be provided on the metal base 10. Meanwhile, the circuit board 51 may be provided on the metal block 20. Moreover, while in FIG. 1, two circuit boards 51 are provided in the semiconductor package 100, the number of circuit boards 51 is not limited to this. The semiconductor package 100 does not necessarily include the circuit board 51.

Moreover, the shape of the upper surface of the metal block 20 is not limited as long as the semiconductor device 50 can be mounted thereon. The shape of the upper surface of the metal block 20 is, for example, quadrangular or circular. Moreover, the shape of the through hole 11 in plan view is not limited as long as the metal block 20 can be contained therein.

These modifications can be applied, as appropriate, to semiconductor packages according to the following embodiments. Note that the semiconductor packages according to the following embodiments are similar to those of the first embodiment in many respects, and thus differences between the semiconductor packages according to the following embodiments and those of the first embodiment will be mainly described below.

Embodiment 2

Figure 6:
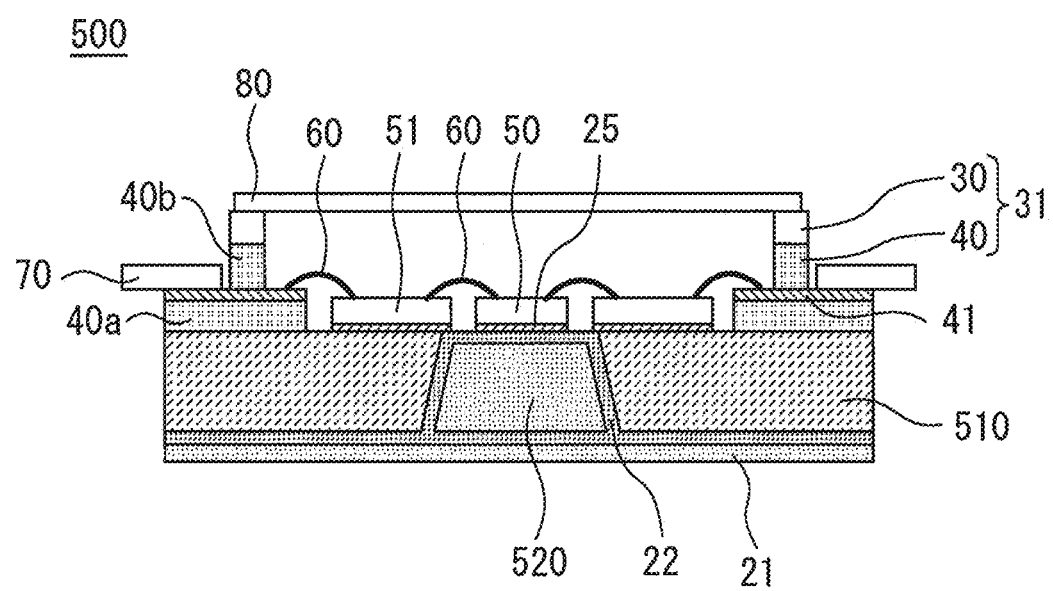
FIG. 6 is a cross-sectional view of a semiconductor package according to Embodiment 2.
Figure 7:
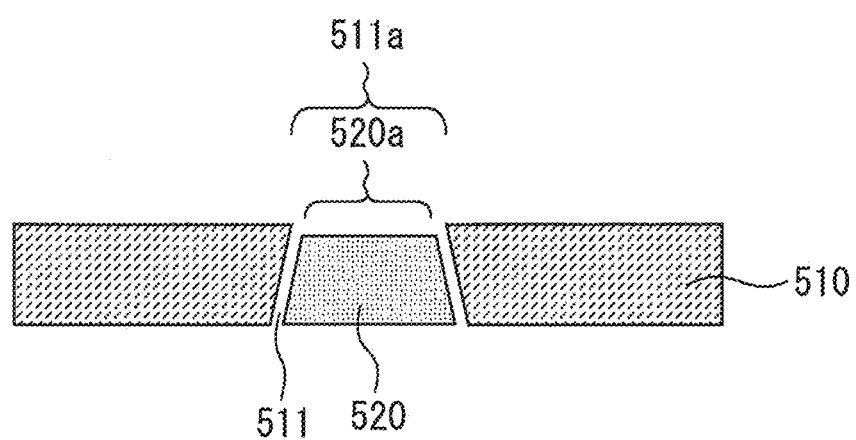
FIG. 7 is a cross-sectional view of a metal base and a metal block according to Embodiment 2.

FIG. 6 is a cross-sectional view of a semiconductor package according to Embodiment 2. A semiconductor package 500 according to the present embodiment is different from that of Embodiment 1 in the shapes of a metal base 510 and a metal block 520. FIG. 7 is a cross-sectional view of the metal base and the metal block according to Embodiment 2. The width of the metal block 520 is larger on the rear surface than on the upper surface. The sectional shape of the metal block 520 is a trapezoid. In the metal block 520, its sectional area in a cross section parallel to the upper surface of the metal base 510 continuously becomes larger toward its rear surface from its upper surface.

Moreover, the sectional shape of a through hole 511 formed in the metal base 510 is also a trapezoid the width of which is larger on the rear surface side of the metal base 510 than on the upper surface side of the metal base 510. In the through hole 511, its sectional area in a cross section parallel to the upper surface of the metal base 510 continuously becomes larger toward the rear surface of the metal base 510 from the upper surface thereof.

The metal block 520 is larger in sectional area on the rear surface than on the upper surface which the semiconductor device 50 is mounted on. With this structure, heat generated from the semiconductor device 50 can be efficiently transmitted to the rear surface side of the semiconductor package 500. Accordingly, this can lead to efficient heat dissipation of the semiconductor device 50.

In the present embodiment, a width 511a of the through hole 511 on the upper surface of the metal base 510 is larger than a width 520a of the upper surface of the metal block 520. As a modification of this, the width 511a of the through hole 511 on the upper surface of the metal base 510 may be smaller than the width 520a of the upper surface of the metal block 520. With this structure, the upper surface of the metal block 520 does not protrude from the upper surface of the metal base 510.

Embodiment 3

Figure 8:
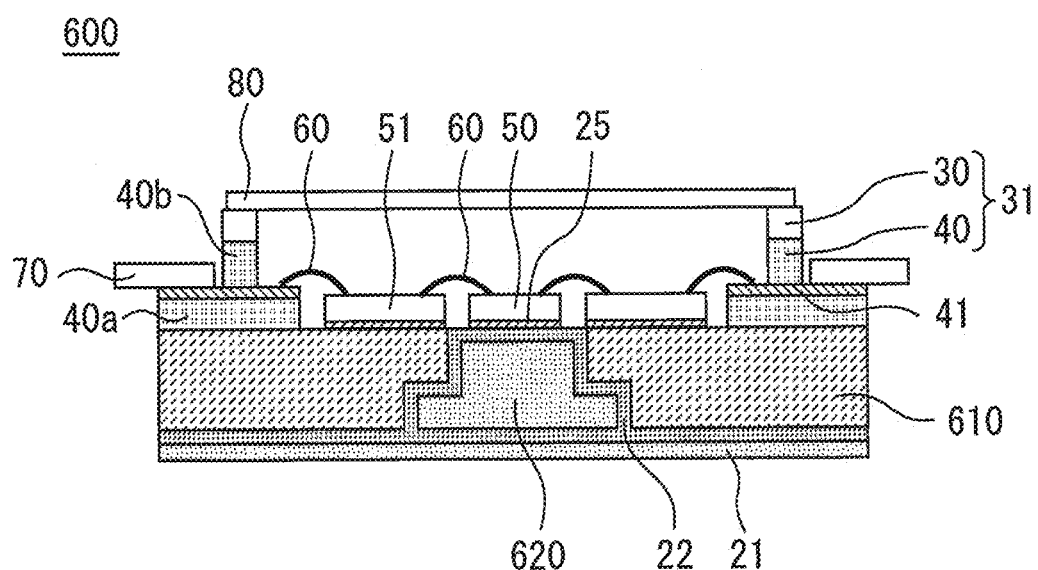
FIG. 8 is a cross-sectional view of a semiconductor package according to Embodiment 3.
Figure 9:
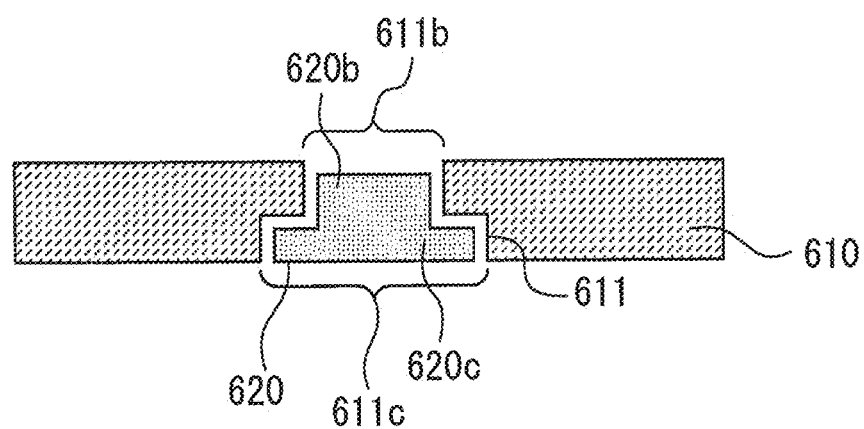
FIG. 9 is a cross-sectional view of a metal base and a metal block according to Embodiment 3.

FIG. 8 is a cross-sectional view of a semiconductor package according to Embodiment 3. A semiconductor package 600 according to the present embodiment is different from that of Embodiment 1 in the shapes of a metal base 610 and a metal block 620. FIG. 9 is a cross-sectional view of the metal base and the metal block according to Embodiment 3. A through hole 611 is formed in the metal base 610. The through hole 611 is composed of a first opening 611b formed on the upper surface of the metal base 610 and a second opening 611c communicating with the first opening 611b. The second opening 611c is larger in width than the first opening 611b and reaches the rear surface of the metal base 610.

The metal block 620 includes a first block 620b and a second block 620c. The first block 620b is provided on the second block 620c, and is smaller in width than the second block 620c. The first block 620b is positioned in the first opening 611b. The width of the first opening 611b is smaller than the width of the second block 620c. Moreover, the height of the first block 620b is not more than the height of the first opening 611b.

The sectional shape of the metal block 620 is convex. In the metal block 620, a step structure is formed on its lateral surface. In the metal block 620, its sectional area in a cross section parallel to the upper surface of the metal base 610 discontinuously becomes larger toward its rear surface from its upper surface. Moreover, a step structure is formed on the lateral surface of the metal base 610 composing the through hole 611. The sectional area of the through hole 611 in a cross section parallel to the upper surface of the metal base 610 discontinuously becomes larger toward the rear surface of the metal base 610 from the upper surface thereof.

There can be a case where the metal block 620 floats up due to surface tension of the brazing material 22 when the metal base 610 and the metal block 620 are connected together with the brazing material 22. In the present embodiment, the width of the first opening 611b is set to be smaller than the width of the second block 620c. Thereby, when the metal block 620 is floating up, the upper surface of the second block 620c comes into contact with the lateral surface of the metal base 610 composing the through hole 611. Accordingly, the lateral surface of the metal base 610 composing the through hole 611 works as a stopper, and the metal block 620 is restricted from moving to the upper surface direction of the metal base 610.

Furthermore, in the present embodiment, the height of the first block 620b is set to be not more than the height of the first opening 611b. Accordingly, the upper surface of the metal block 620 does not protrude from the upper surface of the metal base 610. Notably, each of the step structures on the lateral surface of the metal base 610 composing the through hole 611 and the metal block 620 may have a plurality of steps.

Embodiment 4

Figure 10:
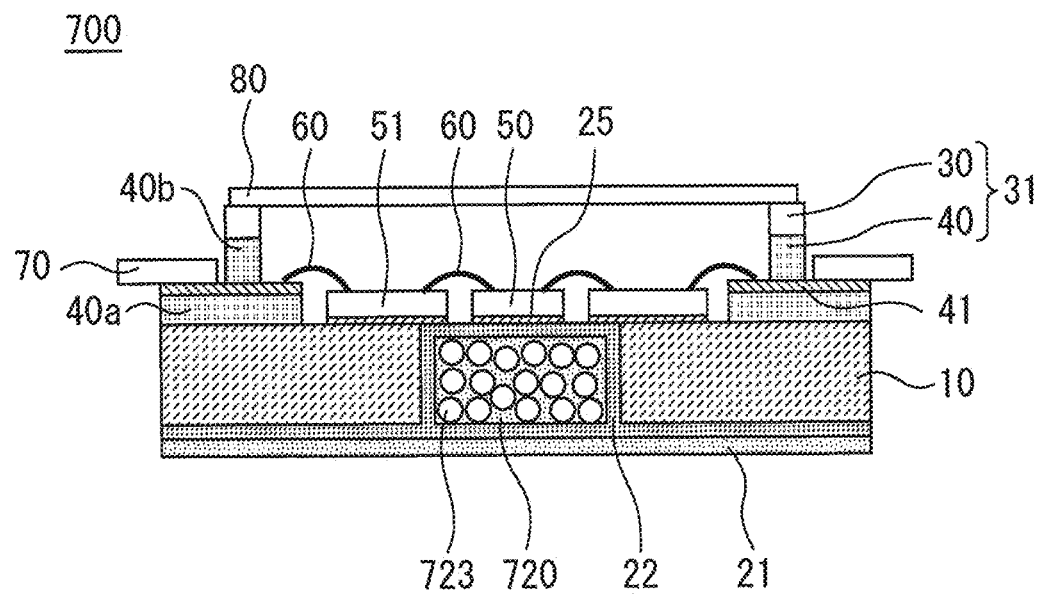
FIG. 10 is a cross-sectional view of a semiconductor package according to Embodiment 4.

FIG. 10 is a cross-sectional view of a semiconductor package according to Embodiment 4. A semiconductor package 700 according to the present embodiment includes a metal block 720. The metal block 720 includes diamond 723. The metal block 720 is formed of a composite obtained by mixing powder diamond 723 with copper. The diamond 723 is higher in thermal conductivity than copper. Therefore, heat generated from the semiconductor device 50 can be more efficiently transmitted and radiated than in a metal block that is formed only of copper. Therefore, the semiconductor package 700 in which a high power semiconductor device 50 is implemented can be provided.

Figure 11:
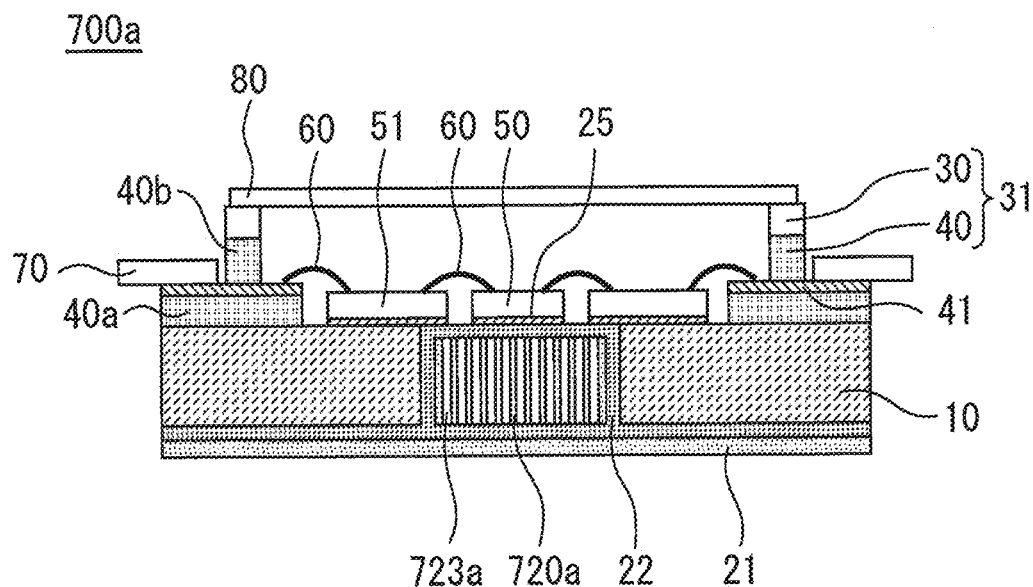
FIG. 11 is a cross-sectional view of a semiconductor package according to a modification of Embodiment 4.

FIG. 11 is a cross-sectional view of a semiconductor package according to a modification of Embodiment 4. A semiconductor package 700a according to the modification includes a metal block 720a, The metal block 720a includes graphite 723a. The metal block 720a is formed of a composite obtained by mixing the graphite 723a with copper. The graphite 723a is higher in thermal conductivity than the diamond 723. Accordingly, heat generated from the semiconductor device 50 can be further efficiently transmitted and radiated.

Embodiment 5

Figure 12:
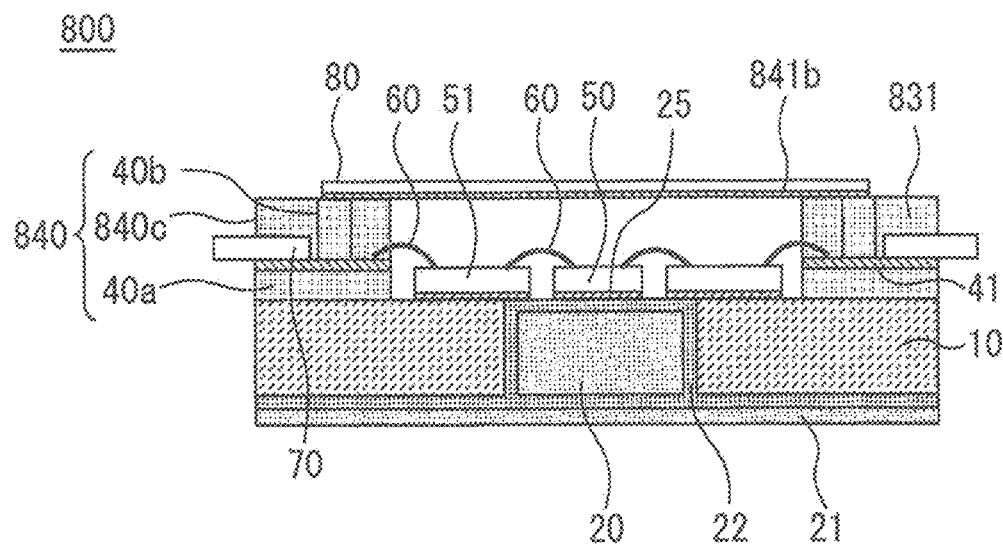
FIG. 12 is a cross-sectional view of a semiconductor package according to Embodiment 5.

FIG. 12 is a cross-sectional view of a semiconductor package according to Embodiment 5. In Embodiment 1, the frame 31 includes the metal frame 30 and the ceramic part 40. The semiconductor package 800 according to the present embodiment includes a frame 831. The frame 831 only includes a ceramic part 840. The frame 831 is a ceramic frame. The ceramic part 840 includes the first ceramic part 40a, the second ceramic part 40b and a third ceramic part 840c.

The third ceramic part 840c encloses the semiconductor device 50. A cutout is formed in the third ceramic part 840c, and the first ceramic part 40a and the second ceramic part 40b are positioned so as to be embedded in the cutout. The structure of the first ceramic part 40a and the second ceramic part 40b is the same as in Embodiment 1. Moreover, the upper surfaces of the second ceramic part 40b and the third ceramic part 840c has the same heights. A metallizing layer 841b for joining to the lid 80 is formed on the upper surfaces of the second ceramic part 40b and the third ceramic part 840c.

In the present embodiment, the frame 831 is provided on the metal base 10 whose difference in coefficient of thermal expansion from ceramics is small. Accordingly, breakage on the ceramic part 840 can be suppressed even when an area of the metal base 10 in contact with the ceramic part 840 is large. Accordingly, the frame 831 composed only of the ceramic part 840 can be directly, joined to the metal base 10.

The frame 31 in Embodiment 1 is composed of two parts of the metal frame 30 and the ceramic part 40. On the contrary, the flame 831 is composed only of the ceramic part 840. Accordingly, the frame 831 can be less expensively obtained than the frame 31, and the semiconductor package 800 can be inexpensively provided.

Embodiment 6

Figure 13:
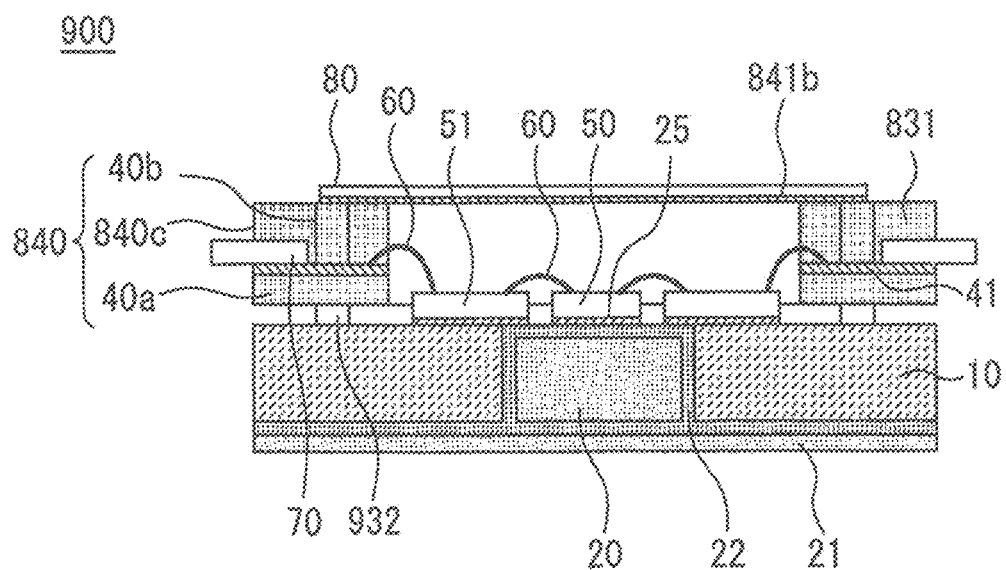
FIG. 13 is a cross-sectional view of a semiconductor package according to Embodiment 6.

FIG. 13 is a cross-sectional view of a semiconductor package according to Embodiment 6. A semiconductor package 900 according to the present embodiment includes a metal ring 932. The metal ring 932 is provided between the frame 831 and the metal base 10. The metal ring 932 encloses the semiconductor device 50. The frame 831 is joined to the metal base 10 via the annular metal ring 932.

In general, higher output of a semiconductor device more increases the implementation area of a circuit board mounted on a semiconductor package. Furthermore, larger external dimensions of the semiconductor package more increases a contact area between a metal base and a frame. In such a case, when a ceramic frame is used as in Embodiment 5, the amount of expansion and shrinkage due to a temperature difference becomes large even if the difference in coefficient of thermal expansion between the metal base and the frame is small. As a result, there is a possibility of breakage on the ceramic frame.

The semiconductor package according to the present embodiment includes the metal ring 932 buffering stress due to expansion and contraction. Accordingly, breakage on the ceramic part 840 can be prevented. Moreover, providing the metal ring 932 buffering the stress can make the frame 831 large. Therefore, an area in which the semiconductor device 50 and the circuit board 51 can be mounted can be made large. Hence, semiconductor devices and circuit boards which have been mounted separately into a plurality of semiconductor packages can be collectively mounted on one semiconductor package 900. Accordingly, a highly integrated circuit can be mounted on the semiconductor package 900. Moreover, the semiconductor package 900 can be inexpensively provided.

Note that the technical features described in the above embodiments may be combined as appropriate.

REFERENCE SIGNS LIST 100, 500, 600, 700, 700a, 800, 900 semiconductor package, 21 metal plate, 11, 511, 611 through hole, 10, 510, 610 metal base, 20, 520, 620, 720, 720a metal block, 22 brazing material, 25 solder, 50 semiconductor device, 31, 831 frame, 80 lid, 70 lead, 40, 840 ceramic part, 611b first opening, 611c second opening, 620b first block, 620c second block, 723 diamond, 723a graphite, 932 metal ring

The invention claimed is:
1. A semiconductor package comprising:
a metal plate;
a metal base, provided on the metal plate, in which a through hole penetrating from an upper surface to a rear surface is formed;
a metal block, provided in the through hole, an upper surface of which is provided at a lower position than the upper surface of the metal base;
a brazing material covering the upper surface of the metal block;
a solder provided on the brazing material;
a semiconductor device provided on the solder;
a frame provided on the metal base and enclosing the semiconductor device;
a lid provided on the frame and covering a region enclosed by the frame; and
a lead electrically connected to the semiconductor device and extending to an opposite side to the semiconductor device relative to the frame, wherein
the frame includes a ceramic part to which the lead is attached,
a difference in thermal expansion coefficient between the metal base and the ceramic part is smaller than a difference in thermal expansion coefficient between the metal block and the ceramic part,
the metal block is higher in thermal conductivity than the metal base, and an arithmetic average roughness of an upper surface of the brazing material is not more than a thickness of the solder.

2. The semiconductor package according to claim 1, wherein the arithmetic average roughness of the upper surface of the brazing material is not more than 0.02 mm.

3. The semiconductor package according to claim 1, wherein a width of the metal block is larger on a rear surface thereof than on the upper surface thereof.

4. The semiconductor package according to claim 3, wherein a width of the through hole on the upper surface of the metal base is smaller than a width of the upper surface of the metal block.

5. The semiconductor package according to claim 3, wherein
the through hole is composed of a first opening formed on the upper surface of the metal base and a second opening communicating with the first opening, being larger in width than the first opening, and reaching the rear surface of the metal base,
the metal block includes a second block and a first block provided on the second block and being smaller in width than the second block,
the first block is positioned in the first opening,
the width of the first opening is smaller than the width of the second block, and
a height of the first block is not more than a height of the first opening.

6. The semiconductor package according to claim 1, wherein the metal block includes diamond.

7. The semiconductor package according to claim 1, wherein the metal block includes graphite.

8. The semiconductor package according claim 1, wherein the frame is composed only of the ceramic part.

9. The semiconductor package according to claim 8, comprising a metal ring provided between the frame and the metal base and enclosing the semiconductor device.

10. The semiconductor package according to claim 1, wherein the ceramic part is joined to the metal base.

* * * * *